United States Patent
Lee et al.

(10) Patent No.: US 7,505,350 B2
(45) Date of Patent: Mar. 17, 2009

(54) VOLTAGE RESET CIRCUITS FOR A SEMICONDUCTOR MEMORY DEVICE USING OPTION FUSE CIRCUIT

(75) Inventors: Hee-Won Lee, Seoul (KR); Dae-Seok Byeon, Gyeonggi-do (KR); Wook-Ghee Hahn, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 106 days.

(21) Appl. No.: 11/642,105

(22) Filed: Dec. 20, 2006

(65) Prior Publication Data
US 2007/0183245 A1     Aug. 9, 2007

(30) Foreign Application Priority Data
Feb. 3, 2006     (KR) .................. 10-2006-0010843

(51) Int. Cl.
*G11C 17/18* (2006.01)
(52) U.S. Cl. .................. 365/225.7; 365/226; 365/228
(58) Field of Classification Search ............ 365/225.7, 365/226, 228
See application file for complete search history.

(56) References Cited

U.S. PATENT DOCUMENTS

| | | | |
|---|---|---|---|
| 5,553,021 A * | 9/1996 | Kubono et al. ......... 365/185.33 |
| 5,898,634 A * | 4/1999 | Chevallier .................. 365/226 |
| 5,914,901 A * | 6/1999 | Pascucci ..................... 365/191 |
| 6,021,067 A * | 2/2000 | Ha ........................... 365/185.21 |
| 6,052,313 A * | 4/2000 | Atsumi et al. .......... 365/189.05 |
| 6,064,619 A * | 5/2000 | Ahn et al. ............... 365/230.03 |
| 6,088,281 A * | 7/2000 | Miyakawa et al. ....... 365/225.7 |
| 6,141,245 A * | 10/2000 | Bertin et al. ........... 365/185.05 |
| 6,260,104 B1 * | 7/2001 | Roohparvar ............... 711/103 |
| 6,282,145 B1 * | 8/2001 | Tran et al. .............. 365/230.06 |
| 6,342,807 B1 * | 1/2002 | Nolan et al. ................ 327/525 |
| 6,346,738 B1 | 2/2002 | Kim et al. ................... 257/529 |
| 6,404,680 B1 * | 6/2002 | Kwon ...................... 365/185.3 |

(Continued)

FOREIGN PATENT DOCUMENTS

JP         10-335594         12/1998

(Continued)

OTHER PUBLICATIONS

Notice to File a Reponse/Amendment to the Examination Report for Korean Patent Application No. 2006-10843; date of mailing Feb. 21, 2007.

*Primary Examiner*—Viet Q Nguyen
(74) *Attorney, Agent, or Firm*—Myers Bigel Sibley & Sajovec (57) ABSTRACT

Control circuits for a voltage regulator of a semiconductor memory device include an option fuse circuit and a fusing control circuit. The option fuse circuit includes a plurality of fuses and a selection circuit that selects one of the plurality of fuses responsive to a control signal. An output voltage associated with the voltage reset circuit is adjusted responsive to a state of the selected one of the plurality of fuses. A fusing control circuit generates the control signal to allow multiple adjustments of the output voltage by the voltage reset circuit. The option fuse circuit may be a plurality of option fuse circuits and the output voltage may be adjusted responsive to the states of the respective selected ones of the plurality of fuses of the option fuse circuits.

9 Claims, 3 Drawing Sheets

U.S. PATENT DOCUMENTS

| | | | |
|---|---|---|---|
| 6,410,352 B2 * | 6/2002 | Damon et al. | 438/14 |
| 6,457,093 B2 * | 9/2002 | Roohparvar | 711/103 |
| 6,459,640 B1 * | 10/2002 | Tani et al. | 365/218 |
| 6,590,825 B2 * | 7/2003 | Tran et al. | 365/225.7 |
| 6,600,676 B2 * | 7/2003 | Shibata et al. | 365/185.04 |
| 6,643,193 B2 * | 11/2003 | Yamaki et al. | 365/189.09 |
| 6,661,710 B2 * | 12/2003 | Kwon | 365/185.24 |
| 6,762,969 B2 * | 7/2004 | Sasaki et al. | 365/225.7 |
| 6,791,893 B2 * | 9/2004 | Pekny et al. | 365/226 |
| 6,912,172 B2 * | 6/2005 | Honma et al. | 365/226 |
| 6,914,842 B2 * | 7/2005 | Huang et al. | 365/225.7 |
| 7,064,986 B2 * | 6/2006 | Lee et al. | 365/185.28 |
| 7,280,415 B2 * | 10/2007 | Hwang et al. | 365/189.09 |
| 7,394,708 B1 * | 7/2008 | Vadi | 365/201 |
| 2005/0194988 A1 | 9/2005 | Kuroki | 324/765 |

FOREIGN PATENT DOCUMENTS

| | | |
|---|---|---|
| JP | 2001-118996 | 4/2001 |
| JP | 2005-252060 | 9/2005 |
| KR | 1020010019488 | 3/2001 |
| KR | 10-2001-0110211 A | 12/2001 |

* cited by examiner

VOLTAGE RESET CIRCUITS FOR A SEMICONDUCTOR MEMORY DEVICE USING OPTION FUSE CIRCUIT

CROSS-REFERENCE TO RELATED APPLICATIONS

This application is related to and claims priority under 35 USC §119 from Korean Patent Application No. 2006-10843 filed on Feb. 3, 2006 in the Korean Intellectual Property Office, the disclosure of which is incorporated herein by reference in its entirety.

BACKGROUND

The present invention relates to internal voltage set circuits for semiconductor memory devices. In particular, the present invention relates to voltage reset circuits and methods for a semiconductor memory device, using option fuse circuits.

Semiconductor memories include microscopic electronic components often used in digital logic systems, such as computers, or applications based on microprocessors, which are widely used in fields from commercial electronic apparatuses to artificial satellites. Therefore, the evolution of technology in fabricating semiconductor memory devices, for higher integration density and faster operation speed, is helpful to establishing a standard of performance for other digital logic systems.

Semiconductor memories are generally classified into volatile and nonvolatile type memory devices. Volatile memories generally are only able to store and read data when power is supplied and then lose their data if power is suspended or interrupted. In contrast, nonvolatile memories, such as mask read only memory (ROM), programmable ROM (PROM), erasable PROM (EPROM), electrically erasable PROM (EEPROM), and so on, are generally able to retain their data even without application of a power supply. Among nonvolatile memories, flash memories are often employed in computers and memory cards where the ability to electrically erase the memory may be beneficial.

A flash memory is typically operable in three operation modes, including programming, erasing, and reading, using voltages having a level higher than a power source voltage in order to conduct some or all of its operations. Such high voltages are usually generated in the flash memory, because direct supply of high voltages from external to the memory may cause malfunctions or even destruction of elements, such as transistors, due to an electric field induced therein. Thus, the flash memory generally uses internally generated high voltages in light of threshold or breakdown voltage characteristics typically found in transistors. A charge pump is a typical element for generating a high voltage from a low voltage in a flash memory device. A high voltage generated from the charge pump is usually regulated to a predetermined static voltage level by a voltage regulator.

Although flash memory chips have been manufactured by way of the same processing steps under the same conditions as other types of memory, there may be errors on the static voltage levels generated in the chips. Errors of static voltage levels by chip products are usually adjusted to desired levels through test operations before shipment. Such adjustments for voltage levels are typically carried out by means of option transaction modes.

Conventional techniques for option transaction include bonding option, metal option, and fuse option. Among them, the fuse option modes, repairing abnormal voltage levels arising from the procedure of fabrication so as to recover normal voltage levels, are often employed in flash memory products. The fuse option modes may be differentiated into laser and electrical cutting types based on the mechanism used for cutting fuses. The laser cutting mode generally blows a fuse by irradiating a laser beam thereon, while the electrical cutting mode usually blows a fuse by passing an excessive current flow therethrough.

As fuses that have already been cut off cannot typically be recovered to their original states of connection, it is typically impossible to readjust voltage levels after once adjusting the voltage levels by a one-time fuse cutoff. For example, even when there is a mistake on a voltage level once adjusted by fuse cutoff during a former test operation or a need of resetting a voltage level that has been once corrected, it is generally impossible to resume the programming of a fuse option on the characteristics of fuses. As a result, a semiconductor memory product, even though it may have no trouble in operating some functions, may be rendered defective because the readjustment of voltage levels thereof is no longer possible.

SUMMARY OF THE INVENTION

In some embodiments of the present invention, control circuits for a voltage regulator of a semiconductor memory device include an option fuse circuit and a fusing control circuit. The option fuse circuit includes a plurality of fuses and a selection circuit that selects one of the plurality of fuses responsive to a control signal. An output voltage associated with the voltage reset circuit is adjusted responsive to a state of the selected one of the plurality of fuses. A fusing control circuit generates the control signal to allow multiple adjustments of the output voltage by the voltage reset circuit. The option fuse circuit may be a plurality of option fuse circuits and the output voltage may be adjusted responsive to the states of the respective selected ones of the plurality of fuses of the option fuse circuits.

In other embodiments, the fusing control circuit includes a fuse option circuit having a reset fuse that generates the control signal. The selection circuit may include a plurality of switch transistors.

In further embodiments, the plurality of fuses of ones of the option fuse circuits include a main fuse and a spare fuse. The fusing control circuit generates the control signal to select the main fuse for a first adjustment of the output voltage and the spare fuse for a subsequent adjustment of the output voltage. The control signal may be a common control signal applied to each of the option fuse circuits having a first state that selects the main fuse and a second state that selects the spare fuse of each of the option fuse circuits. The selection circuit may include a first switch transistor associated with the main fuse and a second switch transistor associated with the spare fuse and the common control signal may include a first signal coupled to the first switch transistor and a second signal coupled to the second switch transistor. The spare fuse may be a plurality of spare fuses associated with respective subsequent adjustments of the output voltage.

In other embodiments, the control signal includes a first control signal that selects the main fuse and a second control signal that selects the spare fuse. The fusing control circuit includes a reset fuse connected between a power source voltage and a first node. A first transistor selectively connects the first node and a ground responsive to a first reset pulse. A first inverter logically inverts a voltage of the first node based on a cutoff state of the reset fuse connected to the first node when the first reset pulse is activated. A second transistor selectively connects the first node and the ground responsive to an output of the first inverter. A second inverter logically inverts an output of the first inverter to generate the second control signal. A third inverter logically inverts an output of the second inverter to generate the first control signal.

In yet other embodiments, each option fuse circuit includes a first switch transistor selectively connecting the main fuse and a second node responsive to the first control signal, the main fuse being coupled between the power source voltage and the first switch transistor. A second switch transistor selectively connects the spare fuse and the second node responsive to the second control signal, the spare fuse being coupled between the power source voltage and the second switch transistor. A third transistor selectively connects the second node and the ground responsive to a second reset pulse. A fourth inverter logically inverts a voltage of the second node based on a cutoff state of a selected one of the main and spare fuse connected to the second node when the second reset pulse is activated. A fourth transistor selectively connects the second node and the ground responsive to an output of the fourth inverter. Fifth and sixth inverters sequentially invert an output of the fourth inverter.

In other embodiments, control circuits for a voltage regulator of a semiconductor memory device include a fusing control circuit and a plurality of option fuse circuits, each of which includes a main fuse and at least one spare fuse. The fusing control circuit generates a control signal to select the main fuse or the spare fuse in each option fuse circuit using a fuse option with a reset fuse. Each option fuse circuit is configured to alternatively cut a selected one of the main and spare fuses responsive to a decoding result for an output voltage.

In further embodiments, methods of resetting an output voltage in a semiconductor memory device include adjusting the output voltage by selectively cutting main fuses included in a plurality of option fuse circuits. A reset fuse of a fusing control circuit coupled to the plurality of option fuse circuits is cut to enable a reset of the output voltage by selecting a spare fuse included each of in the plurality of option fuse circuits rather than the main fuses. The spare fuses included in the option fuse circuits are activated and the main fuses are deactivated responsive to cutting off the reset fuse. The output voltage is reset to a desired level by selectively cutting ones of the activated spare fuses.

BRIEF DESCRIPTION OF THE FIGURES

Some embodiments of the present invention will be described with reference to the following figures, wherein like reference numerals refer to like parts throughout the various figures unless otherwise specified. In the figures.

DETAILED DESCRIPTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

A voltage reset circuit for a semiconductor memory device, according to some embodiments of the present invention, may be configured to include a plurality of option fuse circuits, each of which includes a plurality of fuses. A fusing control circuit of the voltage reset circuit generates a control signal to select one of the plurality of fuses in each option fuse circuit using a fuse option with a reset fuse. Each option fuse circuit adjusts an output voltage at different times by cutting off the selected fuse. As such, it may be possible to generate a desired internal voltage and correct setting thereof, which may enhance a yield of the semiconductor memory products including the voltage reset circuit.

Figure 1:
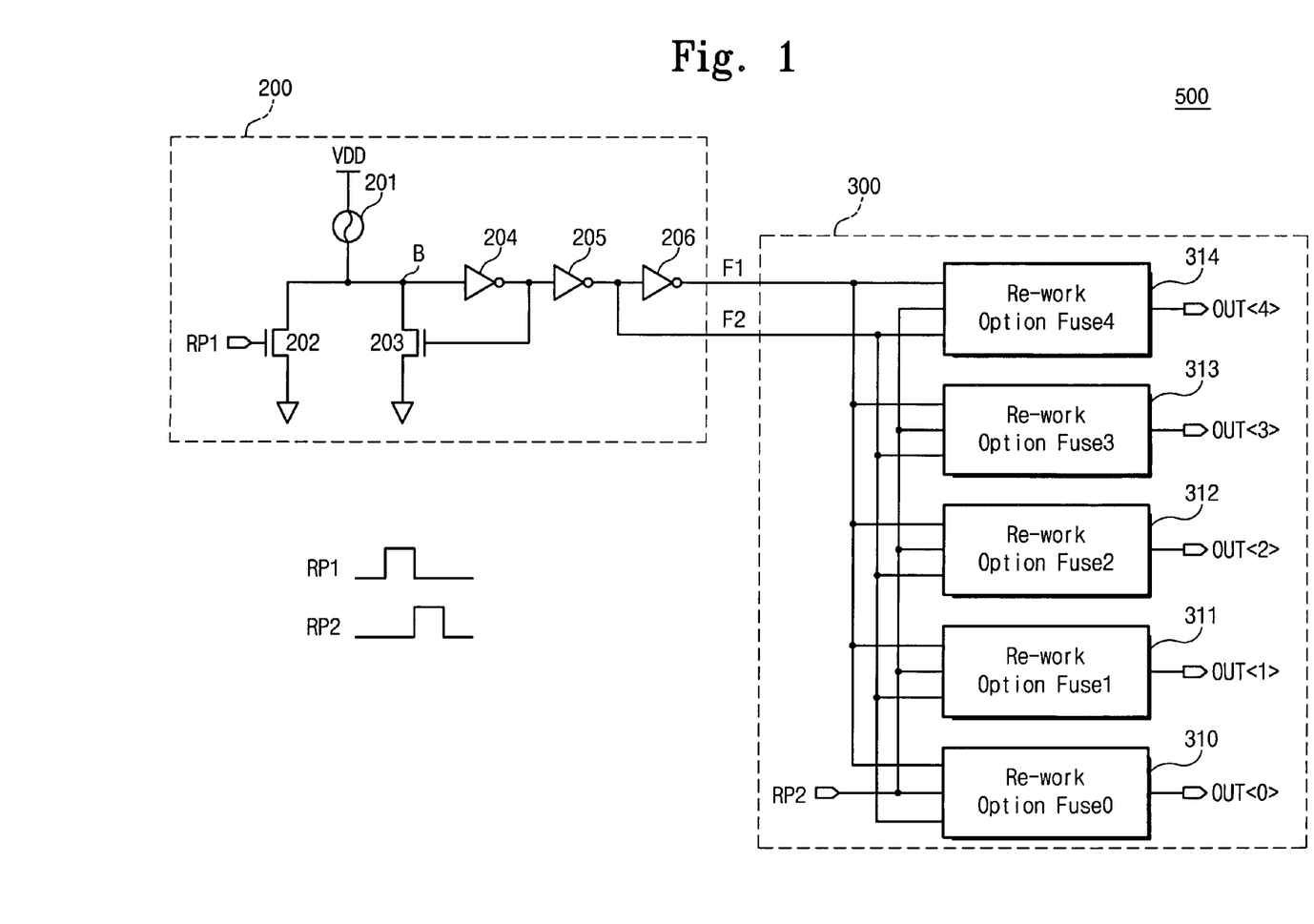
FIG. 1 is a block diagram illustrating the overall structure of a voltage reset circuit for a semiconductor memory device according to some embodiments of the present invention.
Figure 2:
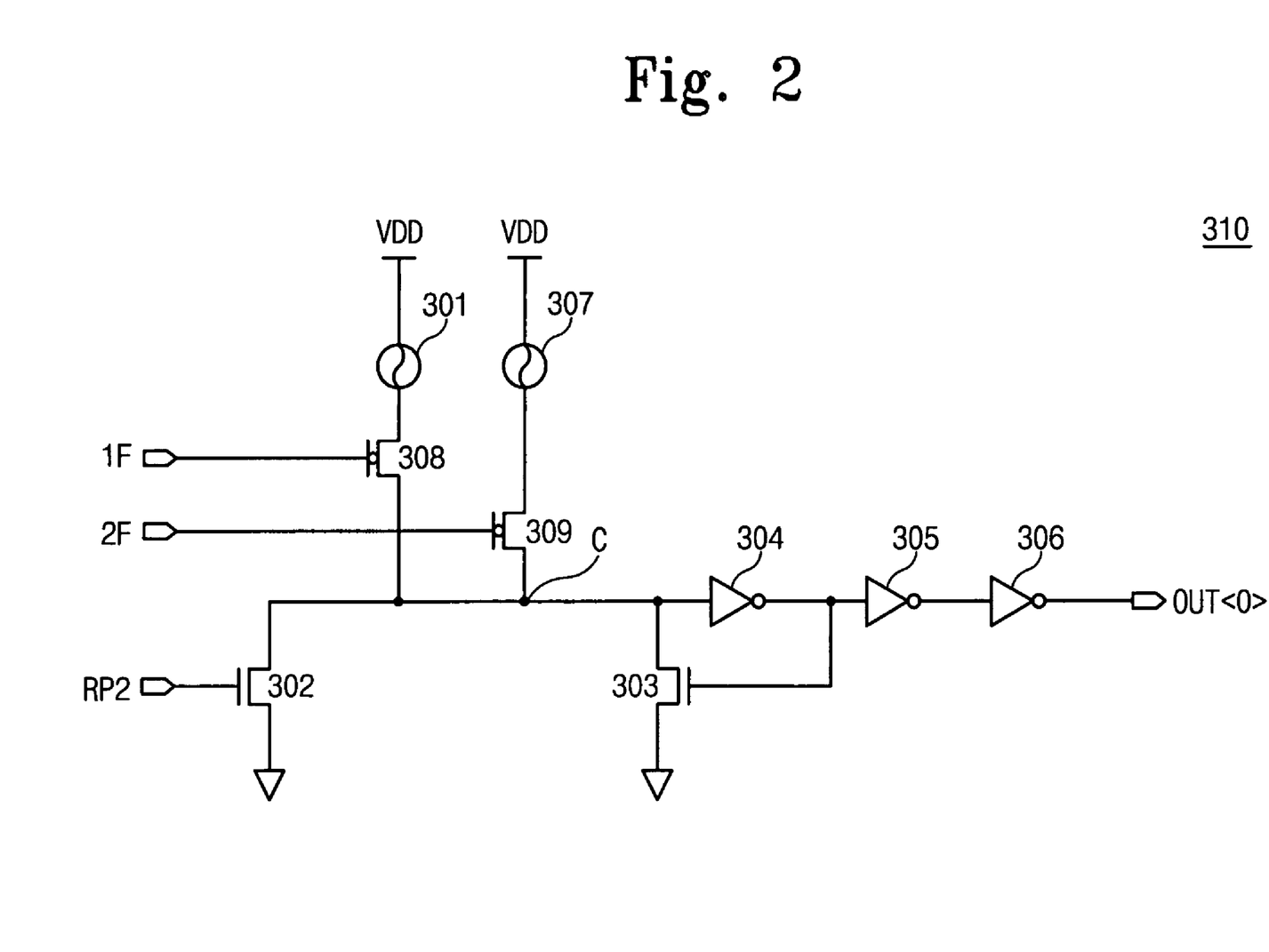
FIG. 2 is a circuit diagram illustrating one of the plural option fuse circuits shown in FIG. 1 according to some embodiments of the present invention.

FIG. 1 is a block diagram illustrating the overall structure of a voltage reset circuit 500 for a semiconductor memory device according to some embodiments of the present invention. Referring to FIG. 1, the voltage reset circuit 500 is includes a fusing control circuit 200 and a fusing circuit 300. The fusing control circuit 200 and the fusing circuit 300 are operable in a fuse option mode. The fusing circuit 300 includes a plurality of re-work option fuse circuits 310 through 314 that are re-operable. Each illustrated option fuse circuit may include a main fuse 301 (FIG. 2) and a spare fuse 307 (FIG. 2). The illustrated fusing control circuit 200 regulates cutoff operations for the fuses included in the option fuse circuits 310 through 314.

Structural details of the fusing control circuit 200 according to some embodiments are further illustrated in FIG. 1. As seen in FIG. 1, the fusing control circuit 200 includes a fuse 201 connected between a power source voltage VDD and a node B, first and second NMOS transistors 202 and 203 connected in parallel between the node B and ground, and serially arranged first through third inverters 204 through 206 connected with the node B. Based on a cutoff state of the fuse 201, the fusing control circuit 200 operates to cut the main or spare fuses included in the option fuse circuits 310 through 314. An output voltage level is determined by cutoff states of the main or spare fuses included in the option fuse circuits 310 through 314. Therefore, the fuse 201 functions as a reset fuse to control a sequence of resetting the output voltage.

For instance, in some embodiments, when the main fuses of the option fuse circuits 310 through 314 are to be cut off, the fuse 201 is not blown out. On the other hand, when the main fuses of the option fuse circuits 310 through 314 are to be cut off, the fuse 201 is blown out. Based on a cutoff state of the fuse 201, it determines voltage levels of control signals F1 and F2 generated from the fusing control circuit 200.

Drain nodes of the first and second NMOS transistors 202 and 203 are connected to the node B in common, receiving a voltage provided from the fuse 201. For example, unless the fuse 201 is cut off, a high-level voltage is supplied from the fuse 201 to the drains of the NMOS transistors 202 and 203. If the fuse 201 is cut off, there is no voltage to the drains of the NMOS transistors 202 and 203. A first reset pulse RP1 is applied to a gate node of the first NMOS transistor 202. The first reset pulse RP1 is input from external (e.g., from a controller or tester) to the memory, and is used to determine voltage levels of the control signals F1 and F2 generated by the fusing control circuit 200. A cutoff state of the fuse 201 is dependent on a control unit (e.g., a controller or tester) that are external to the illustrated voltage reset circuit 500.

If the fuse 201 is cut off, the first NMOS transistor 202 discharges a voltage (i.e., an output of the fuse 201) of the node B into a ground voltage level in response to low-to-high transition of the first reset pulse RP1. The inverter 204 generates a high-level signal from logically inverting the voltage of the node B. The output of the inverter 204 is applied to a gate of the second NMOS transistor 203 and the serially connected second and third inverters 205 and 206. The second NMOS transistor 203 discharges the voltage of the node B into the ground voltage level in response to the high-level signal applied to the gate of the second NMOS transistor 203. The second and third inverters 205 and 206 sequentially logically invert the output of the first inverter 204. The third inverter 206 generates the first fusing control signal F1 from the inversion and the second inverter 205 generates the second fusing control signal F2 from the inversion. Namely, if the fuse 201 is cut off, the third inverter 206 generates the first fusing control signal F1 of a high level and the third inverter 206 generates the second fusing control signal F2 of a low level. During this, the first and second fusing control signals F1 and F2 are fixed at substantially constant levels.

When the fuse 201 is not cut off, if the first reset pulse RP1 goes to high level from a low level and then returns to low level, the voltage of node B (i.e., the output of the fuse 201) is set on high level. The first inverter 204 generates a low-level signal from logically inversing the voltage level of the node B. The second NMOS transistor 203 is turned off in response to the low-level signal applied to its gate. The output of the first inverter 204 is logically inverted through the second and third inverters 205 and 206 in sequence. The third inverter 206 generates the first fusing control signal F1 of a low level from the inversion and the second inverter 205 generates the second fusing control signal F2 of a high level from the inversion. In this case, the first and second fusing control signals F1 and F2 are opposite to their values when the fuse 201 is cut off.

The first and second fusing control signals F1 and F2 generated from the fusing control circuit 200 are applied to the option fuse circuits 310 through 314 included in the fusing circuit 300. In addition, a second reset pulse RP2 is applied to the option fuse circuits 310 through 314. Here, the second reset pulse RP2 is provided from an external source (e.g., a controller or tester) that is outside of the voltage reset circuit 500. The voltage reset circuit 500 is being used to determine levels of outputs OUT<0> through OUT<4> generated from the respective option fuse circuits 310 through 314 responsive to cutoff states of the main and spare fuses 301 and 307 at the initial operation. Each option fuse circuit cuts off the main or spare fuse selected by the first and second fusing control signals F1 and F2. A cutting operation to the fuses 301 and 307 may be carried out based on decoding results (see, e.g., Table 1 below) by output signals to be generated. This may be done before applying the first and second reset pulses RP1 and RP2. This operation may be regulated by a control unit (e.g., a controller or tester) that is outside of but coupled to the voltage reset circuit 500. According to fuse cutoff results by the option fuse circuits 310 through 314, the output signals OUT<0> through OUT<4> are generated therefrom.

FIG. 2 is a circuit diagram illustrating one of the plurality of option fuse circuits 310 through 314 shown in the fusing circuit 300 of FIG. 1 according to some embodiments of the present invention. Referring to FIGS. 1 and 2, the option fuse circuit, e.g., circuit 310, includes a main fuse 301 and a spare fuse 307. The power source voltage VDD is connected to nodes of the main and spare fuses 301 and 307. The other nodes of the main and spare fuses 301 and 307 are, respectively, connected to first and second switch transistors 308 and 309. The first and second switch transistors 308 and 309 may be PMOS transistors.

A source node of the first switch transistor 308 is connected to the main fuse 301 and a drain node of the first switch transistor 308 is connected to a node C. A gate node of the first switch transistor 308 is coupled to the first fusing control signal 1F generated by the fusing control circuit 200. The first switch transistor 308 activates a path connected with the main fuse 301 in response to the first fusing control signal 1F. A source node of the second switch transistor 309 is connected to the spare fuse 307 and a drain node of the second switch transistor 309 is connected to the node C. A gate node of the second switch transistor 309 is coupled to the second fusing control signal 2F generated by the fusing control circuit 200.

The second switch transistor 308 activates a path connected with the spare fuse 307 in response to the second fusing control signal 2F. Namely, the main fuse 301 or the spare fuse 307 is selected in accordance with voltage levels of the first and second fusing control signals 1F and 2F provided from the fusing control circuit 200.

By way of example, unless the fuse 201 is cut off, the first fusing control signal 1F is set on a low level while the second fusing control signal 2F is set on a high level. Then, the first switch transistor 308 is turned on to electrically connect the main fuse 301 with the node C. The second switch transistor 309 is turned off to interrupt connection between the spare fuse 307 and the node C. As a result, the path connected with the spare fuse 307 is inactivated, but the path connected with the main fuse 301 is activated.

If the fuse 201 of the fusing control circuit 200 is cut off, the first fusing control signal 1F is set on a high level while the second fusing control signal 2F is set on a low level. Then, the first switch transistor 308 is turned off to disconnect the main fuse 301 from the node C. The second switch transistor 309 is turned on to electrically connect the spare fuse 307 with the node C. As a result, the path connected with the main fuse 301 is inactivated, but the path connected with the spare fuse 307 is activated. Here, the fuse 201 of the fusing control circuit 200 functions as a reset fuse that is blown out while resetting (or readjusting) the output voltage level.

In some embodiments of the present invention, the voltage reset operation is carried out with first using the main fuse 301 of the option fuse circuit 310. Then, if there is a need of resuming voltage adjustment, it additionally conducts the voltage reset operation by means of the spare fuse 307 after blowing out the fuse (i.e., reset fuse) 201 of the fusing control circuit 200. During this operation, the voltage adjustment with the main fuse 301 or the spare fuse 307 is carried out in accordance with the decoding results (refer to Table 1) of output signals to be generated. These procedures may be carried out by a control unit (e.g., a controller or timer) external to the voltage reset circuit 500.

Referring again to FIG. 2, between the node C and the ground are third and fourth NMOS transistors 302 and 303 in parallel. From the node C, fourth through six serially connected inverters 304 through 306 extend. As illustrated in FIG. 2, the option fuse circuit 310 includes all of the main fuse 301 and the spare fuse 307. However, only a unique one of the fuses will be electrically connected to the node C in actual operation. Thus, the third and fourth NMOS transistors 302 and 303 and the fourth through sixth inverters 304 through 306 operate in association with the selected fuse actually electrically connected to the node C. For instance, if the main fuse 301 is selected to be electrically connected with the node C, the third and fourth NMOS transistors 302 and 303 and the fourth through sixth inverters 304 through 306 operate to generate the output signal OUT<0> in accordance with a cutoff state of the main fuse 301.

If the main fuse 301 is cut off, the third NMOS transistor 302 discharges a voltage of the node C (i.e., an output of the main fuse 301) into the ground voltage level in response to low-to-high transition of the second reset pulse RP2. The fourth inverter 304 generates a high-level signal from logically inversing the voltage level of the node C. The output of the fourth inverter 304 is applied to a gate of the fourth NMOS transistor 303 and the fifth and sixth inverters 305 and 306. The fourth NMOS transistor 303 discharges a voltage of the node C into the ground voltage level in response to the high-level signal that is applied to its gate. The fifth and sixth inverters 305 and 306 logically invert the output of the fourth inverter 304 in sequence. Thus, when the main fuse 301 is cut off, the output signal OUT<0> generated from the sixth inverter 306 has high level (i.e., a value of logic '1').

When the main fuse 301 is not cut off, if the second reset pulse RP2 goes to a high level from a low level and then returns to the low level, a voltage of the node C (i.e., an output of the main fuse 301) goes to a high level again. The fourth inverter 304 generates a low-level signal from logically inverting the voltage of the node C. The fourth NMOS transistor 303 is turned off in response to the low-level signal applied to its gate and the output of the fourth inverter 304 is logically inverted through the fifth and sixth inverters 305 and 306 in sequence. When the main fuse 301 is not cut off (maintains its connection), the output signal OUT<0> generated from the sixth inverter 306 has a low level (i.e., a value of logic '0').

In the voltage reset circuit 500 according to some embodiments of the present invention, the voltage reset operation is carried out at first using the main fuse 301 of the option fuse circuit 310. Then, if there is a need to resume voltage adjustment, it resumes the voltage reset operation by means of the spare fuse 307. In conducting voltage adjustment using the spare fuse 307, the second switch transistor 309 is turned on instead of the first switch transistor 308. In this case, the node C is electrically connected with the spare fuse 307 and not the main fuse 301. This operation of voltage adjustment by the spare fuse 307 may proceed substantially as previously described with reference to the main fuse 301, so such operations need not be further described herein.

The main fuse 301 or the spare fuse 307 may alternatively be cut off in order to obtain a proper value of the output voltage. The determination whether a corresponding one of the main and spare fuses 301 and 307 is cut off or not is dependent on the decoding results with the output signals of the option fuse circuits 310 through 314.

Table 1 below displays exemplary decoding results according to some embodiments with the output signals of the option fuse circuits 310 through 314 shown in FIG. 1.

TABLE 1

| OUT<4> | OUT<3> | OUT<2> | OUT<1> | OUT<0> | Decoded voltage level |
|---|---|---|---|---|---|
| 0 | 0 | 0 | 0 | 0 | 10.0 V |
| 0 | 0 | 0 | 0 | 1 | 10.5 V |
| ... | ... | ... | ... | ... | ... |
| 1 | 1 | 1 | 1 | 0 | 25 V |
| 1 | 1 | 1 | 1 | 1 | 25.5 V |

Referring to Table 1, for instance, when a voltage of 25.5V is to be generated by programming the main fuse 301, the output signals OUT<0> through OUT<4> of the option fuse circuits 310 through 314 are all set to have a logic '1.' As can be seen from FIG. 2, in order to make an output of a corresponding option fuse circuit set on a logic '1', the main fuse 301 is cut off. Therefore, for generating the voltage of 25.5V, all the main fuses 301 of the option fuse circuits 310 through 314 are cut off.

As previously noted, it is generally not possible with prior art systems to reset (or readjust) the output voltage as fuse(s) have already been cut off, even when there is need to readjust an output voltage level by re-arranging the condition of fuse cutoff. Some embodiments of the present invention are able to reset an output voltage by means of the spare fuse 307 even though the main fuse 301 has previously been cut (blown out). As an example, in the case of resetting the output voltage of 25.5V into 25V by means of the main fuse 301, the output signals OUT<1> through OUT<4> of the option fuse circuits 311 through 314 must all be generated as a logic '1' and the output signal OUT<0> of the option fuse circuit 310 must be generated as a logic '0'. For this, the spare fuses of the option fuse circuits 311 through 314 may be cut off while the spare fuse of the option fuse circuit 310 maintains its connection. With such a fuse cutoff pattern, it is possible to reset an output voltage to a new desired level.

Figure 3:
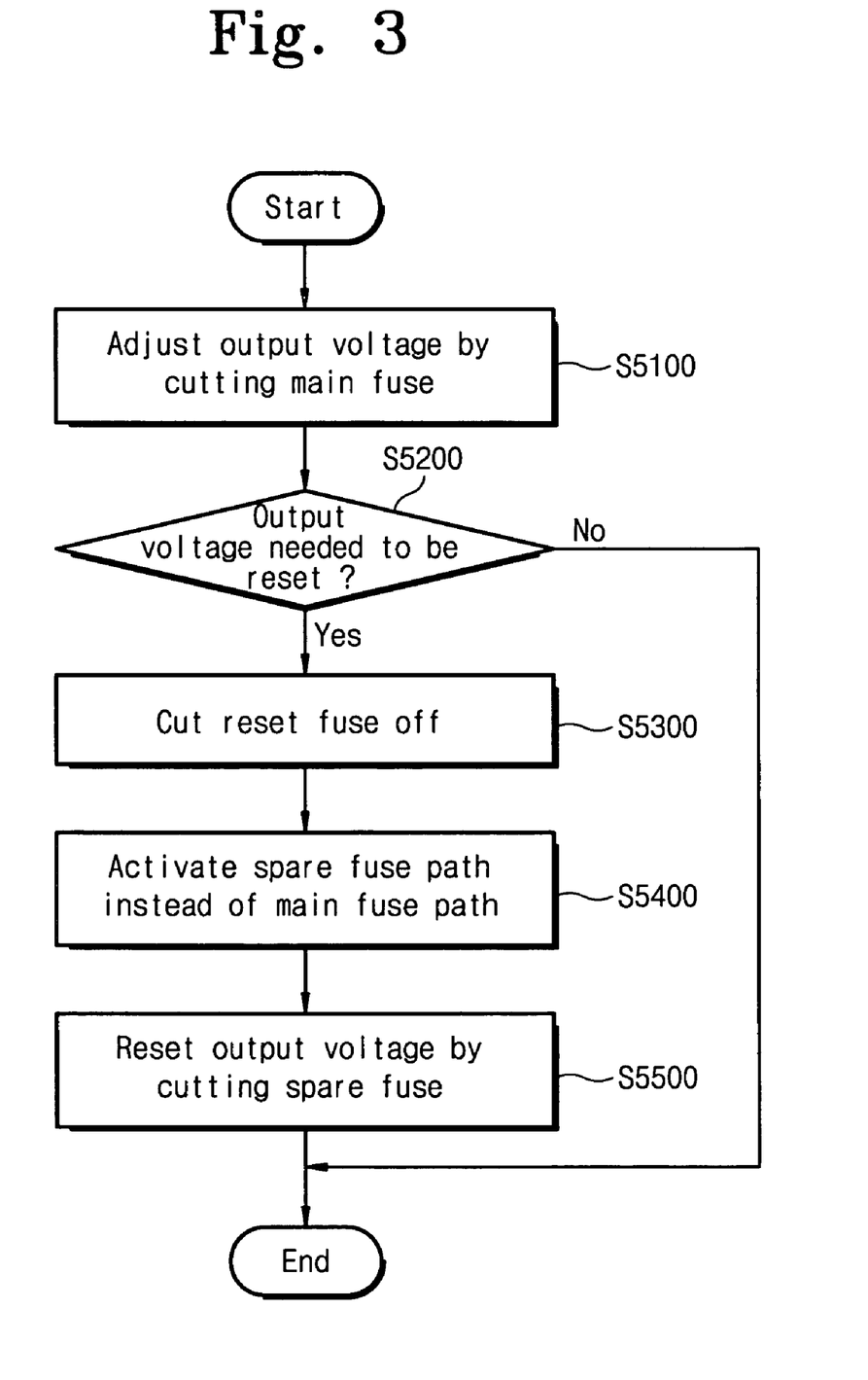
FIG. 3 is a flow chart illustrating a method of resetting a voltage in a semiconductor memory device according to some embodiments of the present invention.

FIG. 3 is a flow chart illustrating a method of resetting a voltage in a semiconductor memory device according to some embodiments of the present invention. Referring now to FIG. 3, operations begin with an output voltage adjustment by cutting off the main fuse 301 (Block S5100). The adjustment of output voltage may be based on the decoding results, such as those seen in Table 1 above, and selectively cutting the main fuses 301 included in the option fuse circuits 310 through 314. During operations at Block S5100, the reset fuse 201 included in the fusing control circuit 200 maintains its connection state without being cut off.

It is then determined if there is a need to reset the output voltage (Block S5200). Such a need for further adjusting the output voltage may arise after completing the voltage adjustment by the main fuse 301 at Block S5100. If there is a need of resetting the output voltage (Block S5200), the reset fuse 201 is cut off (Block S5300). Based on the cutoff of the reset fuse 201, the path of the spare fuse 307 is activated instead of the path of the main fuse 301 (Block S5400). The spare fuse 307 is cut off as needed to reset the output voltage (Block S5500). The output voltage adjustment at Block S5500 may also be carried out with reference to the decoding results, such as those shown in Table 1, selectively cutting the spare fuses 307 included in the option fuse circuits 310 through 314.

As described above, in some embodiments of the present invention, even after once adjusting the output voltage by cutting off the main fuse 301, it is possible to resume the voltage adjustment by additionally cutting off the spare fuse 307. As a result, a number of defects resulting from erroneous fuse cutting operations may be decreased and an improved yield may be provided. As the voltage reset circuit 500 may share the option fuse circuits including plural fuses, it may also not require a greater semiconductor device circuit area even though the number of fuses increases.

In some embodiments, a voltage reset circuit for a semiconductor memory device includes pluralities of option fuse circuits each of which includes pluralities of fuses; and a fusing control circuit generating a control signal to select one from the plural fuses in each option fuse circuit by means of fuse option with a reset fuse. Each option fuse circuit adjusts an output voltage in pluralities of times by way of cutting the selected fuse off.

In other embodiments, a voltage reset circuit for a semiconductor memory device includes pluralities of option fuse circuits each of which includes a main fuse and at least more one spare fuse; and a fusing control circuit generating a control signal to select one from the main and spare fuses in each option fuse circuit by means of fuse option with a reset fuse. Each option fuse circuit alternatively cuts the selected fuse off in response to a decoding result for output voltage.

In some embodiments, the fusing control circuit generates a first control signal to first select the main fuse.

In some embodiments, the fusing control signal generates a second control signal to select the spare fuse after cutting the main fuse off.

In some embodiments, the second control signal is generated after cutting the reset fuse off.

In some embodiments, the fusing control circuit includes a reset fuse connected between a power source voltage and a first node; a first transistor including a current path connected between the first node and a ground, and a control node receiving a first reset pulse; a first inverter logically inverting a voltage of the first node in correspondence with a cutoff state of the reset fuse connected to the first node when the first reset pulse is activated; a second transistor including a current path connected between the first node and the ground, and a control node receiving an output of the first inverter; a second inverter generating the second control signal from logically inverting an output of the first inverter; and a third inverter generating the first control signal from logically inverting an output of the second inverter.

In some embodiments, each option fuse circuit includes the main fuse connected with the power source voltage through one end; a first switch transistor including a current path connected between the other end of the main fuse and a second node, and a control node receiving the first control signal, selectively connecting the main fuse to the second node; the spare fuse connected to the power source voltage through one end; a second switch transistor including a current path connected between the other end of the spare fuse and the second node, and a control node receiving the second control signal, selectively connecting the spare fuse to the second node; a third transistor including a current path between the second node and the ground, and a control node receiving a second reset pulse; a fourth inverter logically inverting a voltage of the second node in correspondence with a cutoff state of the fuse connected to the second node when the second reset pulse is activated; a fourth transistor including a current path connected between the second node and the ground, and a control node receiving an output of the fourth inverter; and fifth and sixth inverters sequentially inversing an output of the fourth inverter.

In further embodiments, a method of resetting a voltage in a semiconductor memory device includes: adjusting an output voltage by selectively cutting main fuses included in pluralities of option fuse circuits; determining to reset the output voltage; cutting a reset fuse to reset the output voltage; activating spare fuses included in the option fuse circuits, instead of the main fuses, in response to a cutoff result of the reset fuse; and resetting the output voltage by selectively cutting the spare fuses.

While in some embodiments described above the option fuse circuits each have two fuses, such a description is exemplary and, in some embodiments, the number of fuses included in each option fuse circuit may be modified and/or patterns of functional blocks for controlling the cutting operations thereof may be modified. Moreover, some embodiments of the present invention may be used with other types of semiconductor devices requiring internal voltages with multiple levels, and the present invention is not limited to nonvolatile memory devices, such as flash memory devices.

Thus, some embodiments of the present invention are able to reset voltage levels even after cutting fuses off in a semiconductor memory device. Thus, it may be possible to generate internal voltages correctly while enhancing a yield in fabricating of semiconductor memory products.

The above-disclosed subject matter is to be considered illustrative, not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A resettable control circuit for a voltage regulator of a semiconductor memory device, comprising:
   an option fuse circuit including a plurality of fuses and a selection circuit that selects one of the plurality of fuses responsive to a control signal, wherein an output voltage associated with a voltage reset circuit including the resettable control circuit is adjusted responsive to a state of the selected one of the plurality of fuses; and
   a fusing control circuit that generates the control signal to allow multiple adustments of the output voltage by the voltage reset circuit, wherein the output voltage is adjusted responsive to the states of the respective selected ones of the plurality of fuses of the option fuse circuits and wherein the fusing control circuit includes a fuse option circuit having a reset fuse that generates the control signal.

2. The control circuit of claim 1, wherein the selection circuit comprises a plurality of switch transistors.

3. A resettable control circuit for a voltage regulator of a semiconductor memory device, comprising:
   an option fuse circuit including a plurality of fuses and a selection circuit that selects one of the plurality of fuses responsive to a control signal, wherein an output voltage associated with a voltage reset circuit including the resettable control circuit is adjusted responsive to a state of the selected one of the plurality of fuses; and
   a fusing control circuit that generates the control signal to allow multiple adjustments of the output voltage by the voltage reset circuit, wherein the output voltage is adjusted responsive to the states of the respective selected ones of the plurality of fuses of the option fuse circuits and wherein the plurality of fuses of ones of the option fuse circuits comprises a main fuse and a spare fuse and wherein the fusing control circuit generates the control signal to select the main fuse for a first adjustment of the output voltage and the spare fuse for a subsequent adjustment of the output voltage.

4. The control circuit of claim 3, wherein the control signal comprises a common control signal applied to each of the option fuse circuits having a first state that selects the main fuse and a second state that selects the spare fuse of each of the option fuse circuits.

5. The control circuit of claim 4, wherein the selection circuit comprises a first switch transistor associated with the main fuse and a second switch transistor associated with the spare fuse and wherein the common control signal comprises a first signal coupled to the first switch transistor and a second signal coupled to the second switch transistor.

6. The control circuit of claim 4 wherein the spare fuse comprises a plurality of spare fuses associated with respective subsequent adjustments of the output voltage.

7. The control circuit of claim 4, wherein the control signal comprises a first control signal that selects the main fuse and a second control signal that selects the spare fuse and wherein the fusing control circuit comprises:
   a reset fuse connected between a power source voltage and a first node;
   a first transistor selectively connecting the first node and a ground responsive to a first reset pulse;
   a first inverter logically inverting a voltage of the first node based on a cutoff state of the reset fuse connected to the first node when the first reset pulse is activated;
   a second transistor selectively connecting the first node and the ground responsive to an output of the first inverter;
   a second inverter logically inverting an output of the first inverter to generate the second control signal; and
   a third inverter logically inverting an output of the second inverter to generate the first control signal.

8. The control circuit of claim 5, wherein each option fuse circuit comprises:
   a first switch transistor selectively connecting the main fuse and a second node responsive to the first control signal, wherein the main fuse is coupled between the power source voltage and the first switch transistor;
   a second switch transistor selectively connecting the spare fuse and the second node responsive to the second control signal, wherein the spare fuse is coupled between the power source voltage and the second switch transistor;
   a third transistor selectively connecting the second node and the ground responsive to a second reset pulse;
   a fourth inverter logically inverting a voltage of the second node based on a cutoff state of a selected one of the main and spare fuse connected to the second node when the second reset pulse is activated;
   a fourth transistor selectively connecting the second node and the ground responsive to an output of the fourth inverter; and
   fifth and sixth inverters sequentially inverting an output of the fourth inverter.

9. The control circuit of claim 1, wherein each of the a plurality of option fuse circuits includes a main fuse and at least one spare fuse and wherein each option fuse circuit is configured to alternatively cut a selected one of the main and spare fuses off responsive to a decoding result for an output voltage.

* * * * *

UNITED STATES PATENT AND TRADEMARK OFFICE
CERTIFICATE OF CORRECTION

| | | |
|---|---|---|
| PATENT NO. | : 7,505,350 B2 | Page 1 of 1 |
| APPLICATION NO. | : 11/642105 | |
| DATED | : March 17, 2009 | |
| INVENTOR(S) | : Lee et al. | |

It is certified that error appears in the above-identified patent and that said Letters Patent is hereby corrected as shown below:

Column 11, Claim 3, Line 22: After "a plurality of fuses" please add -- , a plurality of option fuse circuits, --

Column 11, Claim 3, Line 28: Please correct "gcnerates" to read -- generates --

Signed and Sealed this

Fifth Day of January, 2010

David J. Kappos
*Director of the United States Patent and Trademark Office*